United States Patent [19]

Mizushima

[11] Patent Number: 5,164,334
[45] Date of Patent: Nov. 17, 1992

[54] SEMICONDUCTOR INTEGRATED CIRCUIT DEVICE WITH MULTI-LEVEL WIRING STRUCTURE

[75] Inventor: Kazuyuki Mizushima, Tokyo, Japan
[73] Assignee: NEC Corporation, Tokyo, Japan
[21] Appl. No.: 633,796
[22] Filed: Dec. 26, 1990
[30] Foreign Application Priority Data Dec. 26, 1989 [JP] Japan .................. 1-339602

[51] Int. Cl.$^5$ .................................. H01L 21/44
[52] U.S. Cl. ........................ 437/203; 437/195; 437/228
[58] Field of Search ............... 437/189, 195, 203, 228

[56] References Cited

U.S. PATENT DOCUMENTS

| | | | |
|---|---|---|---|
| 4,624,046 | 11/1986 | Shideler et al. | 437/48 |
| 4,795,722 | 1/1989 | Welch et al. | 437/192 |
| 4,832,789 | 5/1989 | Cochran et al. | 437/203 |
| 4,840,923 | 6/1989 | Flagello et al. | 437/203 |
| 4,866,009 | 9/1989 | Matsuda | 437/203 |
| 4,874,719 | 10/1989 | Kurosawa | 437/203 |
| 4,977,105 | 12/1990 | Okamoto et al. | 437/203 |
| 5,002,902 | 3/1991 | Watanabe | 437/195 |
| 5,017,506 | 5/1991 | Shen et al. | 437/203 |
| 5,019,527 | 5/1991 | Oshima et al. | 437/195 |
| 5,114,879 | 5/1992 | Madan | 437/195 |

Primary Examiner—Brian E. Hearn
Assistant Examiner—Laura Holtzman
Attorney, Agent, or Firm—Laff, Whitesel, Conte & Saret

[57] ABSTRACT

In a multi-level wiring structure of an IC device, an intermediate insulating layer on a portion of a field insulating layer where wiring layers are absent thereabove is selectively removed so that a gas gap is formed between lower wiring layers.

4 Claims, 3 Drawing Sheets

SEMICONDUCTOR INTEGRATED CIRCUIT DEVICE WITH MULTI-LEVEL WIRING STRUCTURE

BACKGROUND OF THE INVENTION

1. Field of the Invention

The present invention relates to a semiconductor integrated circuit (hereinafter referred to "IC") device having a multi-level wiring structure and to a method of manufacturing the same.

2. Description of Related Art

To realize an IC device of high operation speed and high integration density, fine pattern and shallow P-N junction techniques have been widely used. An unit element such as a transistor in the IC device formed by the techniques, however, has inevitably a small capability for operating a load, that is, a wiring load in the IC. In recent, the tendency has been increased, and therefore, how to reduce the wiring load becomes a serious problem.

The wiring load is determined by resistance of wiring itself, and by parasitic capacitances between wiring and substrate and between mutual wirings. To reduce the resistance, the cross-sectional area of the wiring is necessary to be large value, but it is contrary to the recent miniaturization. To reduce the parasitic capacitance, an intermediate insulating layer is necessary to be made of a material having a low dielectric constant (relative dielectric constant) ($\epsilon'$). However, the intermediate insulating layer of the IC device must satisfy various requirements such as good insulation, good covering, chemical stability and strong resistance to moisture. Therefore, a material which has a low dielectric constant cannot be soon employed in IC device in place of a silicon oxide film ($\epsilon' = 3.9$ to $4.0$) and a silicon nitride film ($\epsilon' = 7.8$ to $8.0$) which are now widely used. For example, a silicon organic compound film and a polyimide film can be formed by a spin-coating method and have a low dielectric constant ($\epsilon'$) of 2.0 to 3.0, and therefore, these films are recently paid attention to as an intermediate insulating layer. However, these organic series films lack chemical stability and resistance to moisture comparing with silicon oxide and silicon nitride films formed, for example, by a Chemical Vapor Deposition (hereinafter referred to "CVD") method. Therefore, if the latter is merely replaced by the former, the reliability of the wiring structure is decreased.

SUMMARY OF THE INVENTION

Accordingly, one object of the present invention is to provide an IC device in which the wiring parasitic capacitance between mutual wirings is reduced without changing the wiring structure, its resistance and the material of the intermediate insulating layer.

Another object of the present invention is to provide an effective method of manufacturing the IC device mentioned above.

According to one feature of the present invention, there is provided an IC device which comprises a semiconductor substrate having a major surface; an insulating layer such as a field insulating layer formed on the major surface and having an upper surface; a lower wiring pattern of a first level formed on the upper surface of the insulating layer, the lower wiring pattern including first and second lower wirings each having an upper face and both side faces; an intermediate insulating layer; an upper wiring pattern of a second level formed above the insulating layer and above the lower wiring pattern via the intermediate insulating layer, wherein the intermediate layer is absent on a portion of the insulating layer between the first and second lower wirings.

According to another aspect of the present invention, there is provided a method of manufacturing an IC device which method comprises the steps of forming a lower wiring pattern on an insulating layer formed on a semiconductor substrate; forming entirely an intermediate insulating layer; forming an upper wiring pattern on the intermediate insulating layer; and etching the intermediate insulating layer through a reactive ion etching method of anisotropic etching using the upper and lower wiring patterns as a mask till a surface portion of the insulating layer is exposed where the upper and lower wiring patterns are absent thereabove.

DESCRIPTION OF THE PREFERRED EMBODIMENTS

Prior Art

Figure 1:
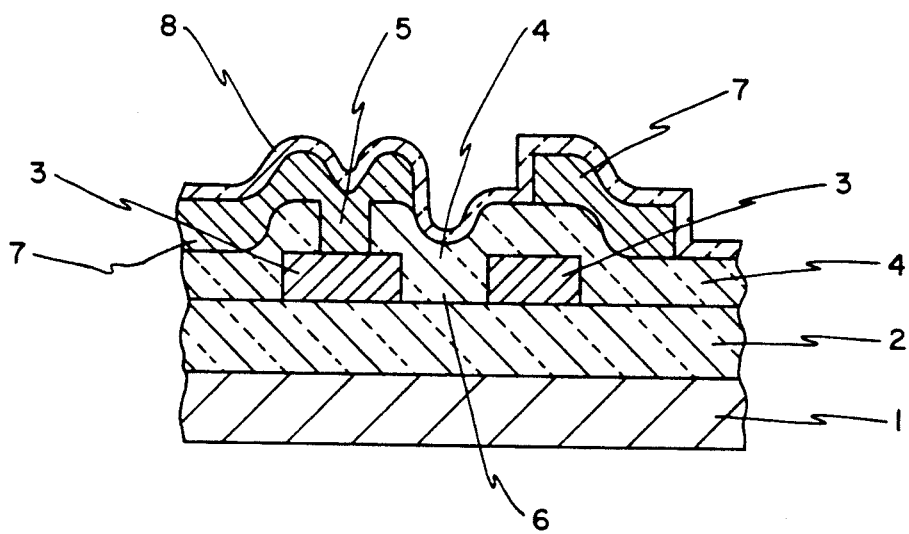
FIG. 1 is a cross-sectional view showing a conventional IC device.

Referring to FIG. 1, a multi-level wiring structure in the prior art will be explained. A thick field insulating layer 2 is formed on a major surface of a semiconductor substrate 1, and a plurality of lower wiring layers 3 of a first level are formed on the field insulating layer. An intermediate insulating layer 4 is entirely formed so that the layer 4 fills the gap 6 between the lower wiring layers 3. Consequently, the parasitic capacitance between the lower wiring layers 3 of the same first level is unfavorably enhanced. A plurality of upper wiring layers 7 of a second level are formed on the intermediate insulating layer 4; one of the upper wiring layers 7 is electrically connected to corresponding one of the lower wiring layers 3 through a via hole 5 formed in the intermediate layer 4, and a passivation film 8 is entirely formed.

First Embodiment of the Present Invention

Figure 2A:
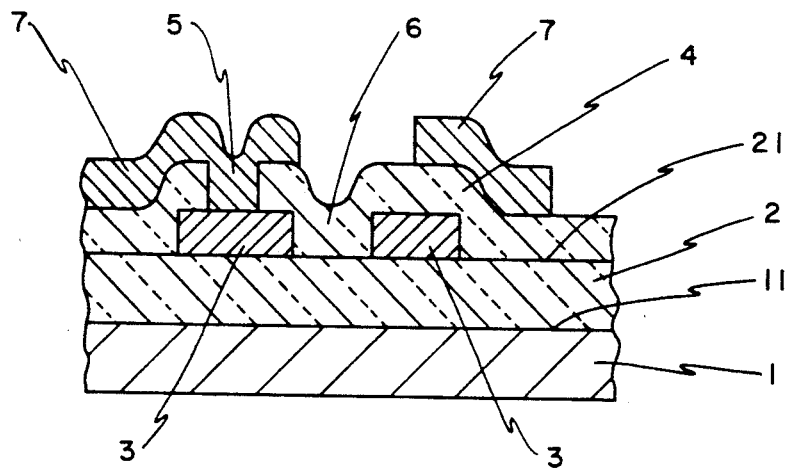
FIGS. 2A to 2C are cross-sectional views arranged in the order of the process steps of fabrication in a first embodiment of the present invention.
Figure 2B:
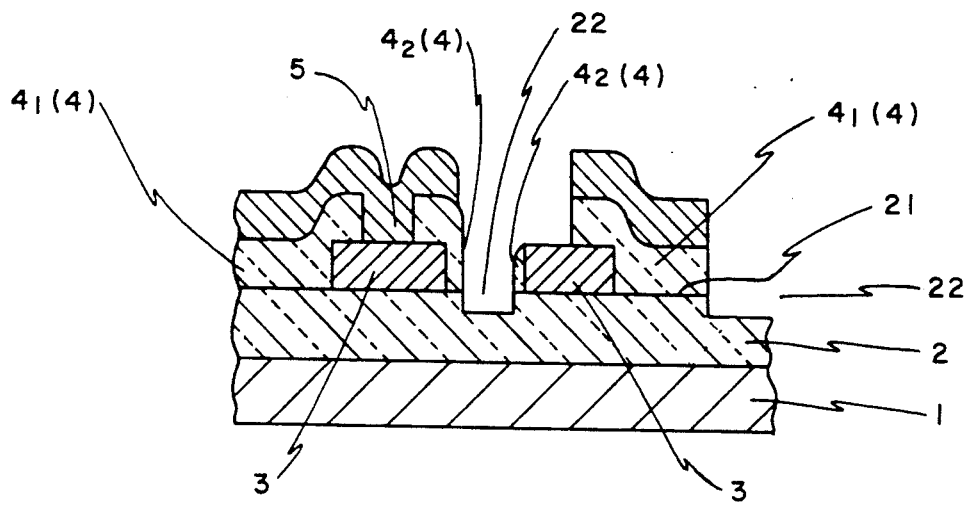
Figure 2C:
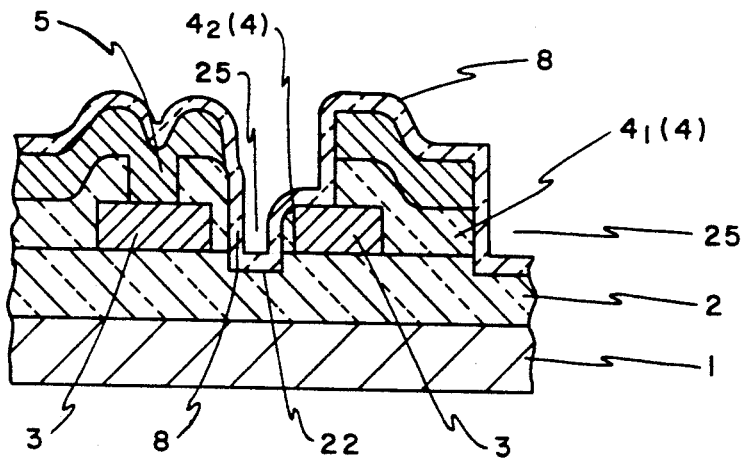

Referring to FIGS. 2A to 2C, main processes of manufacturing a first embodiment will be explained.

At first, as shown in FIG. 2A, a thick field silicon oxide layer 2 of 1.0 μm thickness is thermally formed on a major surface 11 of a silicon substrate 1, in which many circuit elements (not shown) such as transistors, diode, resistors and diffusion wiring are formed. A plurality of lower wirings 3 of a first level made of aluminum or aluminum alloy are formed on an upper surface 21 of the field silicon oxide layer 2, and an intermediate insulating layer 4 made of silicon oxide or silicon nitride by CVD method or PECVD (Plasma Enhanced CVC) method is entirely formed including in a gap 6 between the lower wirings 3. After forming a via hole 5 in the intermediate insulating layer 4, a plurality of upper wiring 7 of a second level made of aluminum or aluminum alloy; one of the upper wiring layers 7 is electrically connected to corresponding one of the lower wiring layers 3 through the via hole 5.

Next as shown in FIG. 2B, the intermediate insulating layer 4 is selectively etched away using the upper and lower wiring layers 7, 4 as a mask through a reactive ion etching (RIE) of anisotropic by a mixture gas of $CH_4$ and $H_2$, so that the same intermediate insulating layer patterns $4_1$ as the upper wiring layers 7 are formed just under the upper wiring layers 7. Further the RIE continues to remove the intermediate insulating layer at the gap 6 between the lower wiring layers 3. Consequently, only side walls $4_2$ of the intermediate insulating layer are left on the respective side faces of the lower wiring layers 3, and concavity 22 is formed in the upper surface 21 of the field silicon oxide layer 2 between the side walls $4_2$, outside the side walls $4_2$ and surface portions of the field silicon oxide layer where the upper and lower wiring layers are absent thereabove. A photo-resist pattern (not shown) which has been used in the patterning for forming the upper wiring layers 7 may be left without removal during the RIE so as to use the photo-resist pattern as a part of the mask in the RIE process. When the conditions of the RIE are set such that the plane part of the intermediate insulating layer is overetched by 30%, the side walls can be formed with a fit shape on the side faces of the lower wiring layer where the upper wiring layers are absent thereabove, and the concavities 22 can be formed in the field silicon oxide layer with an adequate figure.

Next, as shown in FIG. 2C, a thin passivation silicon oxide film 8 of 3000 Å thickness is entirely formed by a reaction of TEOS (tetra-ethoxysilane) and $O_3$ (ozone) at 400° C. temperature, which forming method is useful to form the film 8 on a side face of a deep cavity. The thickness of the passivation film 8 must be determined so that, after forming the film 8, proper gaps or concavities 25 are formed above the concavities 22. The side walls $4_2$ are used to reinforce the passivation film 8. In some cases, the side walls may be omitted, that is, the RIE may be conducted such that the side walls are completely etched away and only the passivation film 8 may play the role for passivation without the side walls $4_2$.

Figure 3A:
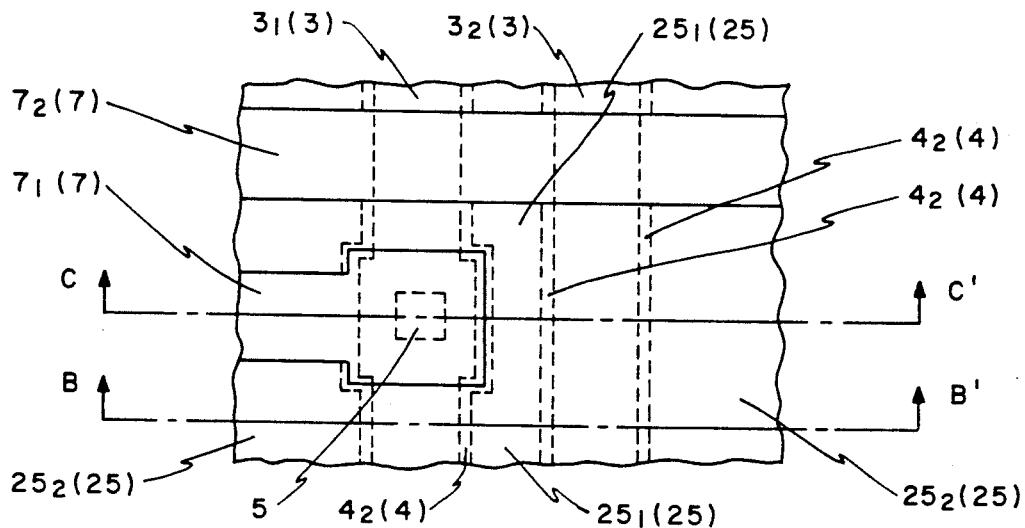
FIG. 3A is a plan view showing the first embodiment of the present invention.
Figure 3B:
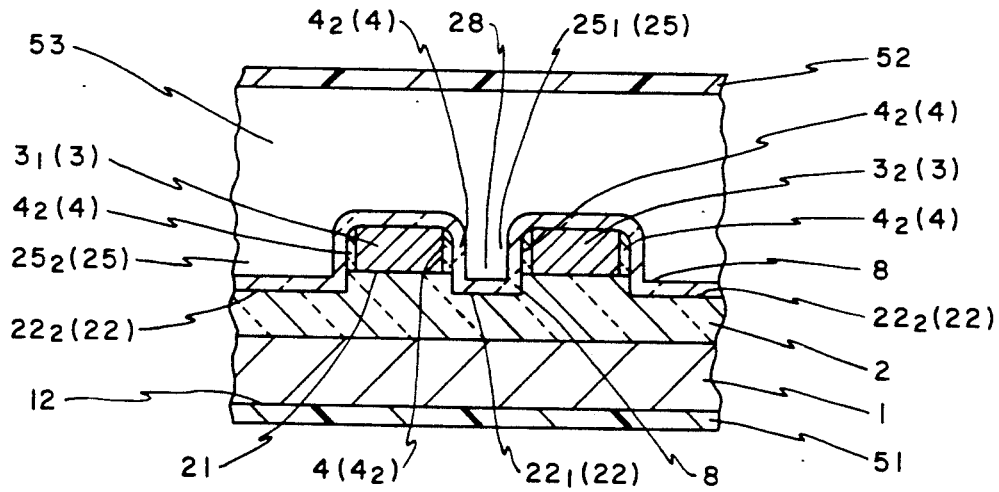
FIG. 3B and FIG. 3C are cross-sectional views taken along line B—B' and line C—C' in FIG. 3A as viewed in the direction of arrows.
Figure 3C:
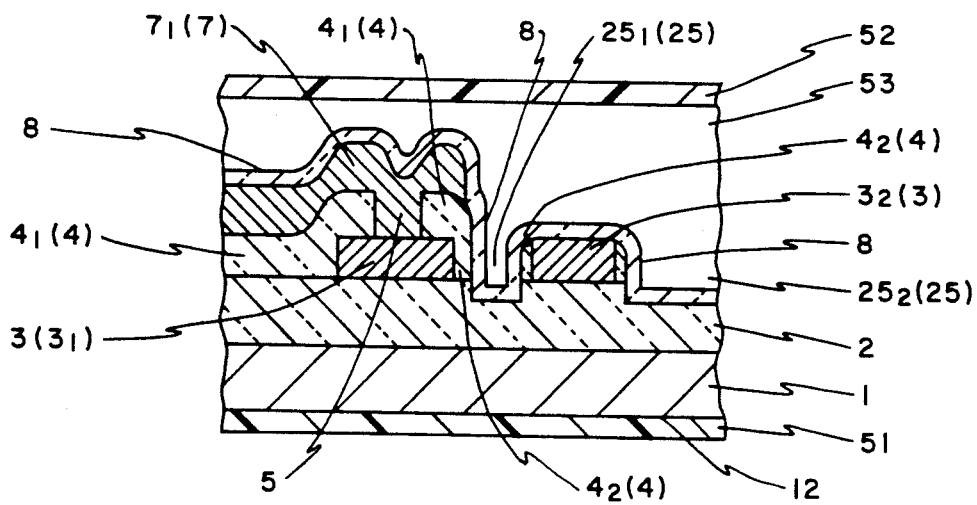

Referring to FIGS. 3A to 3C, an IC device of the first embodiment will be explained. In FIGS. 3A to 3C, the same components as those in FIGS. 2A to 2C are indicated by the same reference numerals.

First and second lower wirings $3_1$, $3_2$ among the lower wirings 3 extend in a first direction in parallel to each other, and first and second upper wirings $7_1$, $7_2$ among the upper wirings 7 extend in a second direction at right angle to the first direction. The intermediate insulating layers $4_1$ have the same pattern as the upper wirings 7, and positioned just under and attached to the bottom faces of the upper wirings. The first upper wiring layer $7_1$ is electrically connected to the first lower wiring layer $4_1$ through the via hole 5, and the second upper wiring layer $7_2$ crosses over the first and second lower wiring layers $3_1$, $3_2$ via the intermediate insulating layer $4_1$. On the side faces of the lower wiring layers 3 ($3_1$, $3_2$) except parts under the upper wiring layers 7 ($7_1$, $7_2$), side walls $4_2$ made of intermediate insulating layer 4 are formed, and recesses or concavities 22 are selectively formed in the upper surface 21 of the field insulating layer 2 where the lower and upper wiring layers and the side walls are absent thereabove. Among the concavities 22, a concavity $22_1$ is positioned between the first and second lower wiring layers $3_1$, $3_2$, and concavities $22_2$ are positioned outside the pair of the first and second lower wiring layers. After the formation of the thin intermediate insulating film 8, gaps 25 are formed on the respective concavities 22; gaps $25_1$ and $25_2$ are formed above the concavities $22_1$ and $22_2$, respectively. Favorably, the bottom 28 of the gap $25_1$ is depressed lower than the upper surface 21 of the field insulating layer 2, that is, than the bottom of the lower wiring layer 3. Therefore, the depth of the concavity $22_1$ is favorably deeper than the thickness of the passivation film 8.

The semiconductor device, that is, the semiconductor chip or pellet mentioned above is bonded at its back surface 12 to a ceramic body 51 of a ceramic package or a glass-sealed package, and sealed by a lid 52. In the package inert gas such as nitrogen or air is filled, and therefore, at the gap $25_1$ and also other gaps $25_2$, a gas (air or inert gas) having a low dielectric constant exists. Consequently, the parasitic capacitance between the first and second lower wiring layers $3_1$, $3_2$ is remarkably reduced. Moreover, the parasitic capacitance between the first upper wiring layer $7_1$ and the second lower wiring layer $3_2$ can be reduced although, in this embodiment, a little.

Second Embodiment of the Present Invention

Figure 4:
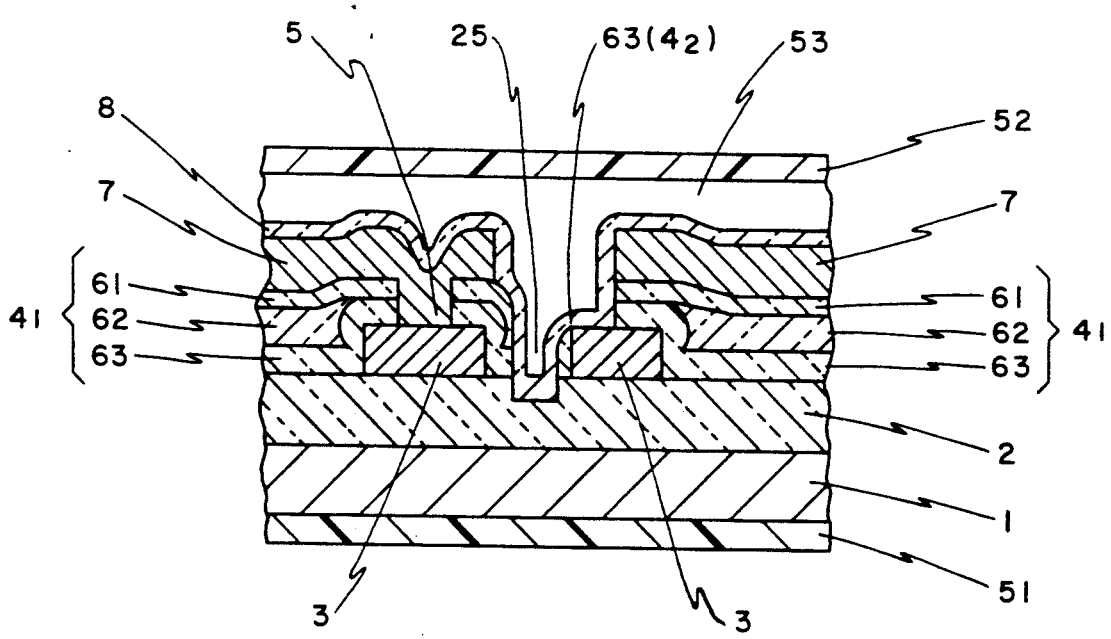
FIG. 4 is a cross-sectional view showing a second embodiment of the present invention.

Referring to FIG. 4, an IC device of a second embodiment will be explained. In FIG. 4, the same components as those in FIGS. 2 and 3 are indicated by the same reference numerals. The intermediate insulating layer $4_1$ formed only under the upper wirings layers 7 consists of upper and lower insulating films 61, 63 and an inner insulating film 64. The films 61, 63 are made of silicon oxide or silicon nitride by CVD method or PECVD method, and the film 62 which is used to reduce the height of the steps is made of SOG (Spin-on-Glass) film. The side wall $4_2$ is made of the film 63. According to the second embodiment, both of the parasitic capacitance reduction and the surface flatness are realized.

According to the present invention, so-called air gap is employed in a section of an isolation between wiring layers. Therefore, the parasitic capacitance between wiring layers of the same level and of different level can be reduced.

Heretofore, a parasitic capacitance between mutual wirings has been small comparing with a parasitic capacitance between a wiring and a substrate. However, in recent miniaturized device technology, both parasitic capacitances become nearly equal value to each other, and with the further progress of miniaturization, the ratio of the parasitic capacitance between mutual wiring to the total parasitic capacitance would be enhanced, and therefore, the advantage of the present invention becomes remarkable.

The present invention can be adapted in three or more-level wiring structure as well as two-level wiring structure which is exemplified in the embodiments.

What is claimed is:

1. A method of manufacturing a semiconductor integrated circuit device comprising the steps of forming a lower wiring pattern on a field insulating layer formed on a semiconductor substrate; forming entirely an intermediate insulating layer; forming an upper wiring pattern on said intermediate insulating layer; and etching said intermediate insulating layer through a reactive ion etching method of anisotropic etching using said upper and lower wiring patterns as a mask until a surface portion of said field insulating layer is exposed where said upper and lower wiring patterns are absent thereabove, said etching being performed so that side walls made of said intermediate insulating layer remain on both wiring pattern.

2. A method of manufacturing a semiconductor integrated circuit device of claim 1, in which said etching continues so that a concavity is formed at said surface portion of said field insulating layer.

3. A method of manufacturing a semiconductor integrated circuit device, said method comprising the steps of forming a lower wiring pattern on a field insulating layer which has a thickness and is formed on a semiconductor substrate; forming entirely an intermediate insulating layer; forming an upper wiring pattern on said intermediate insulating layer; and etching said intermediate insulating layer through a reactive ion etching method of anisotropic etching using said upper and lower wiring patterns as a mask until a surface portion of said field insulating layer is exposed where said where said upper and lower wiring patterns are absent thereabove, said etching being continuously performed from said surface portion of said field insulating layer inwardly by a depth which is shallower than said thickness of said field insulating layer so that a concavity having a bottom constituted of said field insulating layer is formed in said field insulating layer from said surface portion thereof.

4. A method of manufacturing a semiconductor integrated circuit device of claim 3, in which said etching is performed so that side walls made of said intermediate insulating layer remain on both side faces of respective lower wirings constituting said lower wiring pattern.

* * * * *